(12) United States Patent
Moshchansky-Livingston et al.

(10) Patent No.: US 8,995,482 B1
(45) Date of Patent: Mar. 31, 2015

(54) HIGH ENERGY SEMICONDUCTOR LASER

(75) Inventors: Peter Moshchansky-Livingston, Palos Verdes Estates, CA (US); Richard A. Hutchin, Calabasas, CA (US)

(73) Assignee: Optical Physics Company

( * ) Notice: Subject to any disclaimer, the term of this patent is extended or adjusted under 35 U.S.C. 154(b) by 1122 days.

(21) Appl. No.: 12/938,727

(22) Filed: Nov. 3, 2010

(51) Int. Cl.
H01S 3/13 (2006.01)
H01S 3/08 (2006.01)
H01S 5/10 (2006.01)

(52) U.S. Cl.
CPC .................................... *H01S 5/1071* (2013.01)
USPC ................................ 372/32; 372/98; 372/102

(58) Field of Classification Search
USPC .............................................. 372/32, 98, 102
See application file for complete search history.

(56) References Cited

U.S. PATENT DOCUMENTS

| | | | | |
|---|---|---|---|---|
| 4,405,236 A | * | 9/1983 | Mitsuhashi et al. | 356/459 |
| 4,797,896 A | * | 1/1989 | Kane | 372/94 |
| 4,851,368 A | * | 7/1989 | Behfar-Rad et al. | 438/39 |
| 4,995,047 A | | 2/1991 | Hadley et al. | |
| 5,121,400 A | * | 6/1992 | Verdiell et al. | 372/32 |
| 5,227,911 A | * | 7/1993 | Schiller et al. | 359/222.1 |
| 5,305,334 A | * | 4/1994 | Margalit et al. | 372/32 |
| 6,826,224 B2 | | 11/2004 | Yuri et al. | |
| 6,876,689 B2 | * | 4/2005 | Walling et al. | 372/94 |
| 7,227,881 B2 | * | 6/2007 | Govorkov et al. | 372/57 |
| 7,260,282 B2 | * | 8/2007 | Salib et al. | 385/11 |
| 7,443,903 B2 | * | 10/2008 | Leonardo et al. | 372/97 |
| 7,457,340 B2 | | 11/2008 | Botez | |
| 2008/0225904 A1 | * | 9/2008 | Brown et al. | 372/22 |

OTHER PUBLICATIONS

Goldberg et al., "Injection Locking of Coupled-Stripe Diode Laser Arrays", *American Institute of Physics*, vol. 46, No. 3, pp. 236-238 (1985).
Hohimer et al., "Single-Channel Injection Locking of a Diode-Laser Array with a CW Dye Laser", *American Institute of Physics*, vol. 47, No. 12, pp. 1244-1246 (1985).
Goldberg et al., "Injection Locking and Single-Mode Fiber Coupling of a 40-Element Laser Diode Array", *American Institute of Physics*, vol. 50, No. 24, pp. 1713-1715 (1984).
Lau et al., "Strong Optical Injection-Locked Semiconductor Lasers Demonstrating > 100-GHz Resonance Frequencies and 80-GHz Intrinsic Bandwidths", *Optics Express*, vol. 16, No. 9, pp. 6609-6618 (2008).

(Continued)

*Primary Examiner* — Colleen A Matthews
*Assistant Examiner* — Vu A Vu
(74) *Attorney, Agent, or Firm* — The Belles Group, P.C.

(57) ABSTRACT

A high energy semiconductor laser capable of high optical efficiency includes a master oscillator coupled to a plurality of slave oscillators, each producing a laser beam that is substantially at the same wavelength as the output beam from the master oscillator. The outputs of the slave oscillators are then coherently combined to a single monochromatic beam having an optical power which is substantially greater than that of beam output from the master oscillator. The slave oscillators can be configured as ring resonators. A suitable ring oscillator can be built by arranging one or more semiconductor diode laser gain media, two or more reflecting mirrors, and at least one semireflective mirror in a ring configuration. A suitable ring oscillator can also be built by machining a solid block to include one or more semiconductor diode laser high gain regions.

2 Claims, 11 Drawing Sheets

(56) References Cited

OTHER PUBLICATIONS

Tromborg et al., "Transmission Line Description of Optical Feedback and Injection Locking for Fabry-Perot and DFB Lasers", *IEEE Journal of Quantum Electronics*, vol. QE-23, No. 11, pp. 1875-1889 (1987).

Annovazzi-Lodi et al., "Chaos and Locking in a Semiconductor Laser Due to External Injection", *IEEE Journal of Quantum Electronics*, vol. 30, No. 7, pp. 1537-1541 (1994).

Lang, "Injection Locking Properties of a Semiconductor Laser", *IEEE Journal of Quantum Electronics*, vol. QE-18, No. 6, pp. 976-983 (1982).

Cheung et al., "Diffractive-Optics-Based Beam Combination of Phase-Locked Fiber Laser Array", *Optics Letters*, vol. 33, No. 4, pp. 354-356 (2008).

"High-Power 10 W 9xx nm Fiber-Coupled Diode Laser with Feedback Protection, 6398-L4i Series", *JDS Uniphase Corporation*, 6 pages (2008).

\* cited by examiner

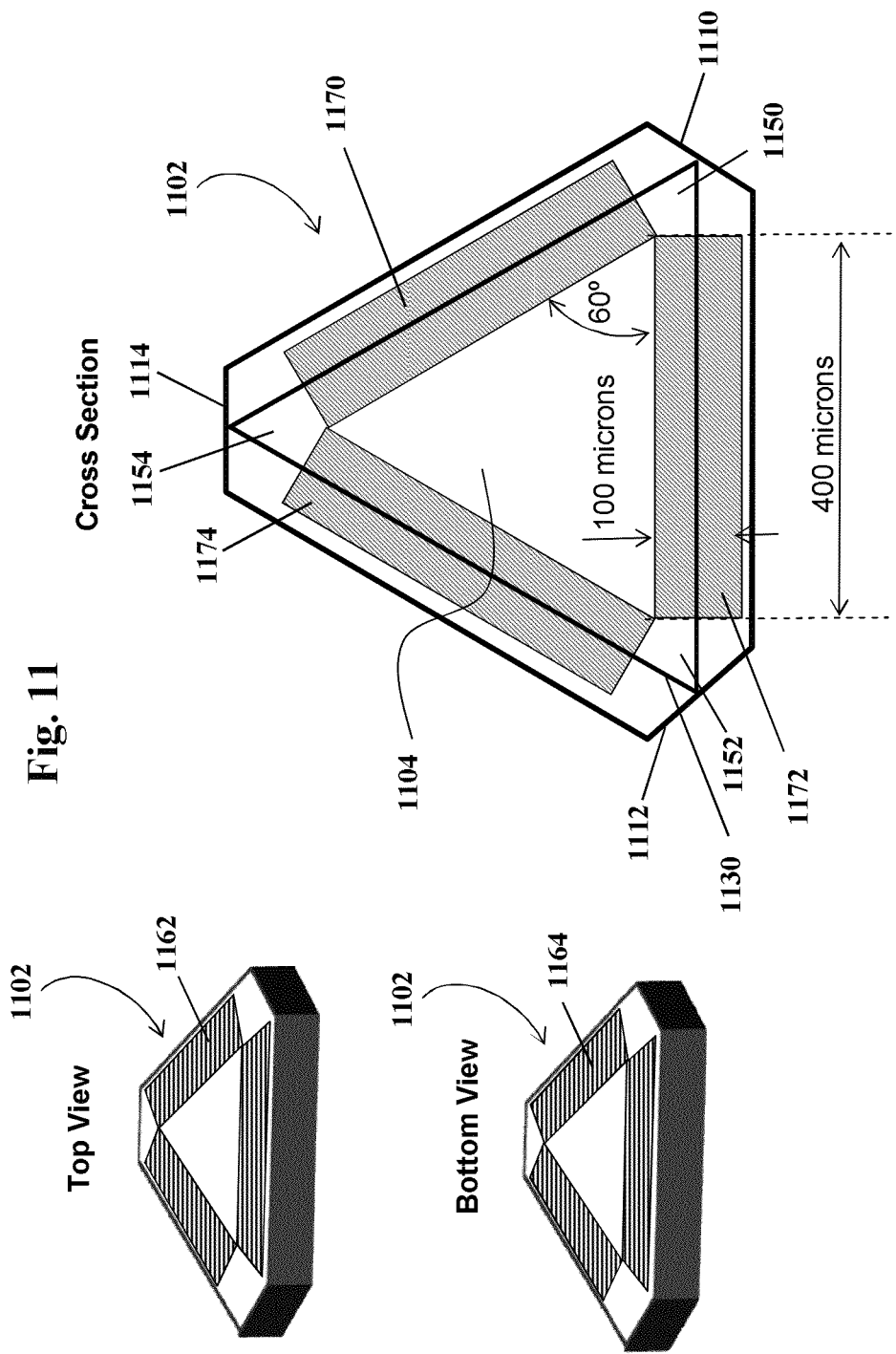

HIGH ENERGY SEMICONDUCTOR LASER

BACKGROUND OF THE INVENTION

1. Field of the Invention

The field of the present invention relates to the field of semiconductor lasers and methods of combining the outputs of semiconductor lasers.

2. Background

In the current art, most high energy lasers are either chemical lasers or solid state lasers. Many high energy solid state lasers are optically pumped by semiconductor lasers. Even though the optical pump semiconductor diode lasers themselves may have wall plug efficiencies approaching 70-80%, the pumping quantum defect and the mismatch between the spectrum of the semiconductor diode laser and the gain medium absorption band of the solid state laser limit solid state laser efficiencies to around 20-25%. This low efficiency is common to all solid state lasers, whether they are of fiber or slab design. Furthermore, the waste heat which is a result of the low efficiency must be extracted and dissipated, adding to the solid state laser system mass and footprint. On the other hand, while chemical lasers have higher energy extraction efficiency, they are encumbered by heavy optical structures, feed systems and dangerous chemicals.

Semiconductor lasers work differently than solid state lasers. Because of this, laser specialists tend to consider them a separate category from solid state lasers, although strictly speaking semiconductors are solid state devices. Semiconductor lasers are based on semiconductor gain media where the optical gain is achieved by stimulated emission at an intraband transition under conditions of high carrier density in the conduction band. Most semiconductor lasers are fashioned as waveguides terminated with end mirrors and with electrical current flowing through the device perpendicular to the waveguide optical cavity axis. One notable exception is the vertical-cavity surface-emitting laser (VCSEL) that has its optical cavity axis along the direction of current flow rather than perpendicular to the current flow.

Semiconductor diode lasers are a pervasive technology with hundreds of millions of them sold annually across the globe. High efficiency and high power diode lasers have been built, in particular to optically pump high energy solid state lasers.

This invention is aimed at using such highly efficient and high power semiconductor lasers to produce high energy lasers (HEL) with output power exceeding one kilowatt. Since overall HEL system mass and footprint are inversely proportional to optical efficiency (i.e., higher efficiency means lower weight and smaller size), for lightweight and compact designs, it is highly desirable that the HEL systems composed of these high power laser diode gain media exhibit high overall optical efficiency, e.g., 70% or more.

SUMMARY OF THE INVENTION

The present invention is directed towards a high energy semiconductor laser with high optical efficiency. The high energy semiconductor laser includes a master oscillator, an optical amplifier that amplifies the master oscillator output beam, a plurality of slave oscillators coupled to the optical amplifier each producing a laser beam that is substantially at the same wavelength as the laser beam output from the master oscillator, and a coherent beam combiner. A master oscillator laser thus serves as the seed laser to a bank of slave oscillator lasers whose outputs can be coherently combined to produce a single monochromatic beam with substantially more power than the master oscillator beam.

The slave oscillators may be configured as regenerative amplifiers that operate above their oscillation threshold so that they can be locked to the master oscillator to reproduce not only master oscillator frequency but also the master oscillator phase. Unlike conventional amplifiers, the slave oscillators which are configured as regenerative amplifiers impress little noise of their own on their output signals. This feature enables a plurality of these slave oscillator outputs to be combined to produce a coherent and stable high power beam.

The slave oscillator may be constructed as a ring resonator comprising a gain medium, two reflecting mirrors and a third semireflective mirror. The ring resonator configuration is advantageous because it requires no polarization separation for its input and its output. The semireflective mirror receives an input beam from the optical amplifier and directs the output from the ring resonator to the coherent beam combiner. The two reflective mirrors direct the received beam through the gain medium. Additional lenses can be added between the two reflecting mirrors and the gain medium to shape the beam before and after it travels through the gain medium. A gain medium that can be accessed at two ends is convenient for implementation.

A more compact slave oscillator may be constructed by integrating multiple discrete components of the slave oscillator together inside a single gain medium block.

Accordingly, a high energy semiconductor laser is disclosed. Advantages of the improvements will appear from the drawings and the description of the preferred embodiment.

BRIEF DESCRIPTION OF THE DRAWINGS

In the drawings, wherein like reference numerals refer to similar components:

FIG. 11 schematically illustrates a sample solid block with three high gain regions.

DETAILED DESCRIPTION OF THE PREFERRED EMBODIMENTS

Figure 1:
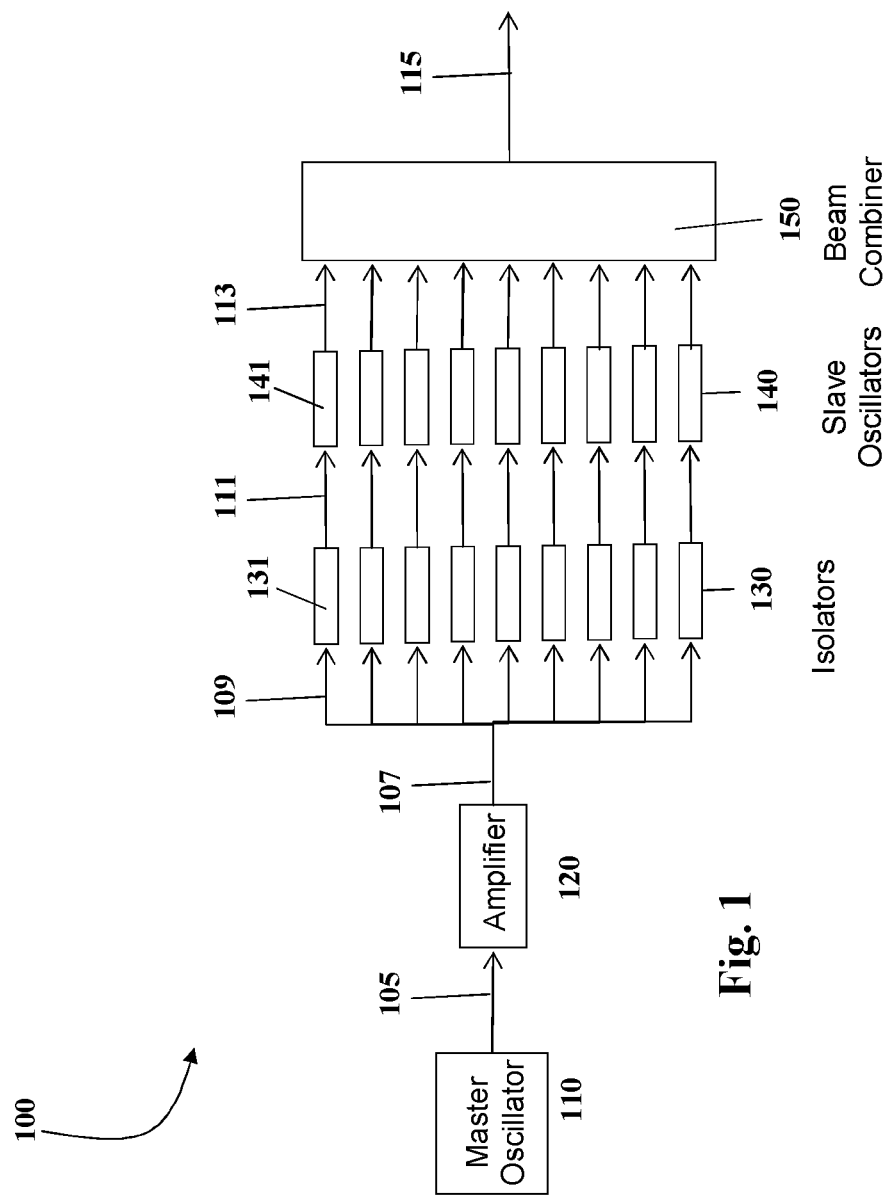
FIG. 1 schematically illustrates a first high energy semiconductor laser.

Turning in detail to the drawings, FIG. 1 illustrates the architecture of the high energy semiconductor laser 100. A master oscillator laser 110 (sometimes called a seed laser) is optically coupled to an optical amplifier 120 which in turn is coupled to a bank of slave oscillators 140 through a bank of optical isolators 130. The beam 105 from the master oscillator 110 serves as the seed for the bank of slave oscillators 140. The optical amplifier 120 increases the power of the master oscillator beam 105 sufficiently (e.g., nominally by 10 to 12 dB) so that the resulting amplified beam 107 has enough power to drive a bank of slave oscillators 140 when split into multiple beamlets 109 which each drive a single slave oscillator 141 through a an optical isolator 131. The output beams 113 from the bank of slave oscillators 140 are then coherently combined to one single beam 115 using one of the coherent beam combining methods known in the art. The resulting beam 115 has a power greater than the beam 105 from the master laser.

The master oscillator 110 may be any laser with the required longitudinal coherence length operating at the desired wavelength. Its output power will typically be around 1 watt, which is sufficient to operate the optical amplifier 120. One potential configuration for the optical amplifier 120 is the same as that of the slave oscillators 141, namely a ring resonator which will be explained later. The bank of optical isolators 130 are composed of a plurality of optical isolators 131 which are well known in the art as optical components which allow the transmission of light in only one direction. The bank of slave oscillators 140 are composed of a plurality of slave oscillators 141. Two preferred embodiments of a single slave oscillator 141 are described later.

Figure 2:
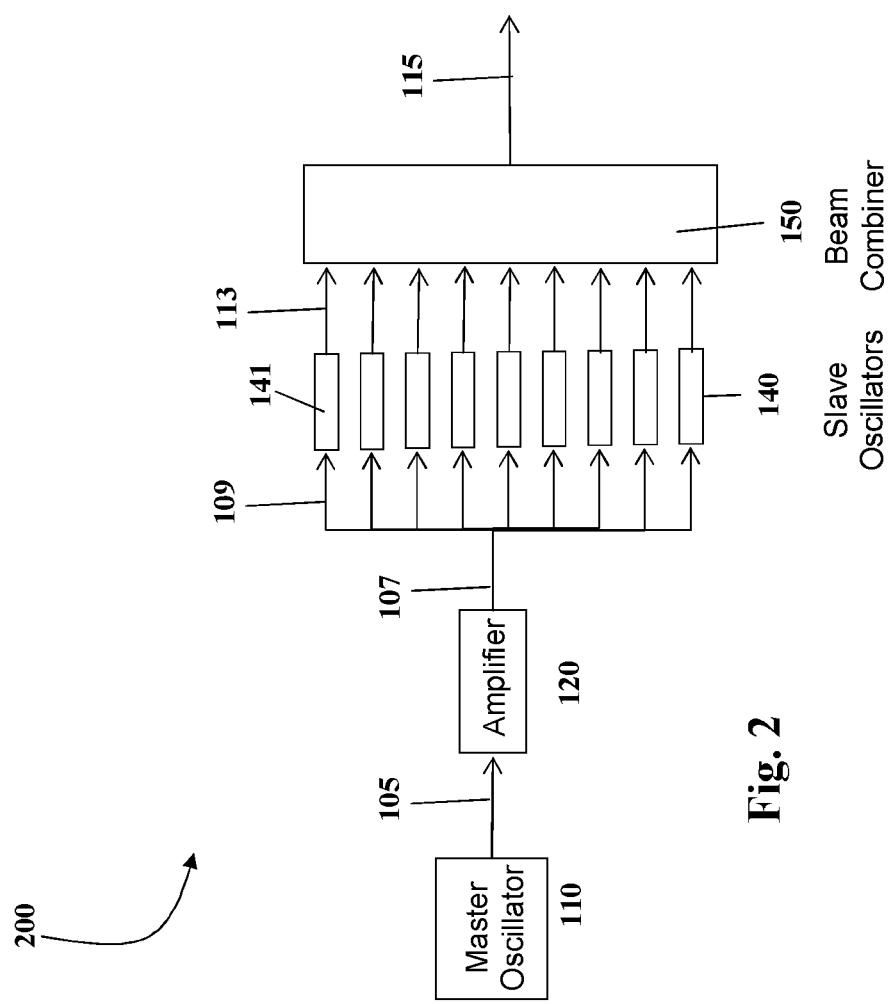
FIG. 2 schematically illustrates a second high energy semiconductor laser.

The bank of optical isolators 130 may be omitted if unwanted feedback from the bank of slave oscillators 140 can be prevented. One way to prevent undesirable feedback is to configure the slave oscillator 141 to be a ring resonator as illustrated later in FIG. 4. FIG. 2 illustrates the architecture of the high energy semiconductor laser 200 where the bank of optical isolators is omitted. A master oscillator laser 110 is optically coupled to an optical amplifier 120 which in turn is coupled to a bank of slave oscillators 140. The beam 105 from the master oscillator 110 serves as the seed for the bank of slave oscillators 140. The optical amplifier 120 increases the power of the master oscillator beam 105 sufficiently (e.g., nominally by 10 to 12 dB) so that the resulting amplified beam 107 has enough power to drive a bank of slave oscillators 140 when split into multiple beamlets 109 which each drive a single slave oscillator 141. The output beams 113 from the bank of slave oscillators 140 are then coherently combined to one single beam 115 using one of the coherent beam combining methods known in the art. The resulting beam 115 has a power greater than the beam 105 from the master laser.

Figure 3:
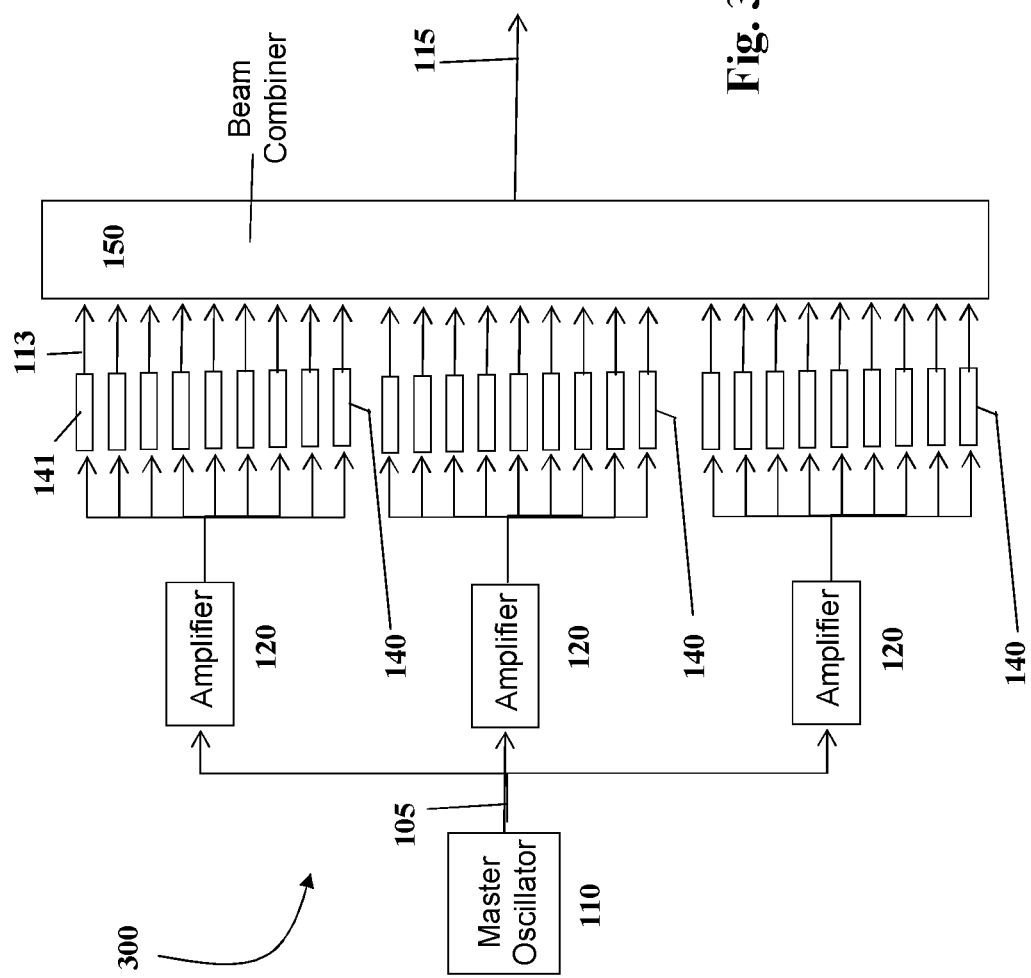
FIG. 3 schematically illustrates a third high energy semiconductor laser.

FIG. 3 illustrates the extension of the architecture shown in FIG. 2 where the output 105 from the master oscillator 110 is coupled to a plurality of optical amplifiers 120 which are themselves coupled to a plurality of banks of slave oscillators 140. The beam 105 from the master oscillator 110 serves as the seed for the banks of slave oscillators 140. Each of the optical amplifiers 120 increase the power of the master oscillator beam 105 sufficiently so that each of the resulting amplified beams has enough power to drive a bank of slave oscillators 140 when split into multiple beamlets which each drive a single slave oscillator 141. The output beams 113 from the banks of slave oscillators 340 are then coherently combined to one single beam 115 using one of the coherent beam combining methods known in the art. The resulting beam 115 has a power greater than the beam 105 from the master laser.

There are several modification options for the high energy semiconductor lasers 100, 200 and 300. One option is to replace the optical amplifier 120 with either a single slave oscillator 141 which is configured as a ring resonator or a bank of slave oscillators similar to the bank of slave oscillators 140. In the latter case the output 105 from the master oscillator 110 would be split into multiple paths with each path coupled to the input of a single slave oscillator 141. A second option is to insert an optical isolator 131 between the master oscillator 110 and the optical amplifier 120.

Note that even though FIG. 1, FIG. 2, and FIG. 3 depict banks of slave oscillators 140 containing nine slave oscillators 141, the actual number may vary within limits set by the injected power requirement.

There are several standard approaches to the beam combiner 150. One particularly attractive method is through use of a Diffractive Optical Element (DOE) as described by E. C. Cheung et al. in a paper titled "Diffractive-optics-based beam combination of a phase-locked fiber laser array", published in Optics Letters, Vol. 33, No. 4, Feb. 15, 2008, the contents of which are incorporated herein by reference in their entirety. Many other approaches known to those of skill in the relevant arts can also be used.

The optical path interconnects between the elements of the high energy semiconductor lasers 100, 200, and 300, i.e., master oscillator 110, optical amplifier 120, bank of optical isolators 130, bank of slave oscillators 140, and the beam combiner 150 can be optical fiber or air paths. It is likely that the interconnects extending from the optical amplifier 120 to the bank of slave oscillators 140 are fibers. It is also likely that the individual slave oscillators 141 will be coupled to the beam combiner 150 by optical fibers.

Figure 4:
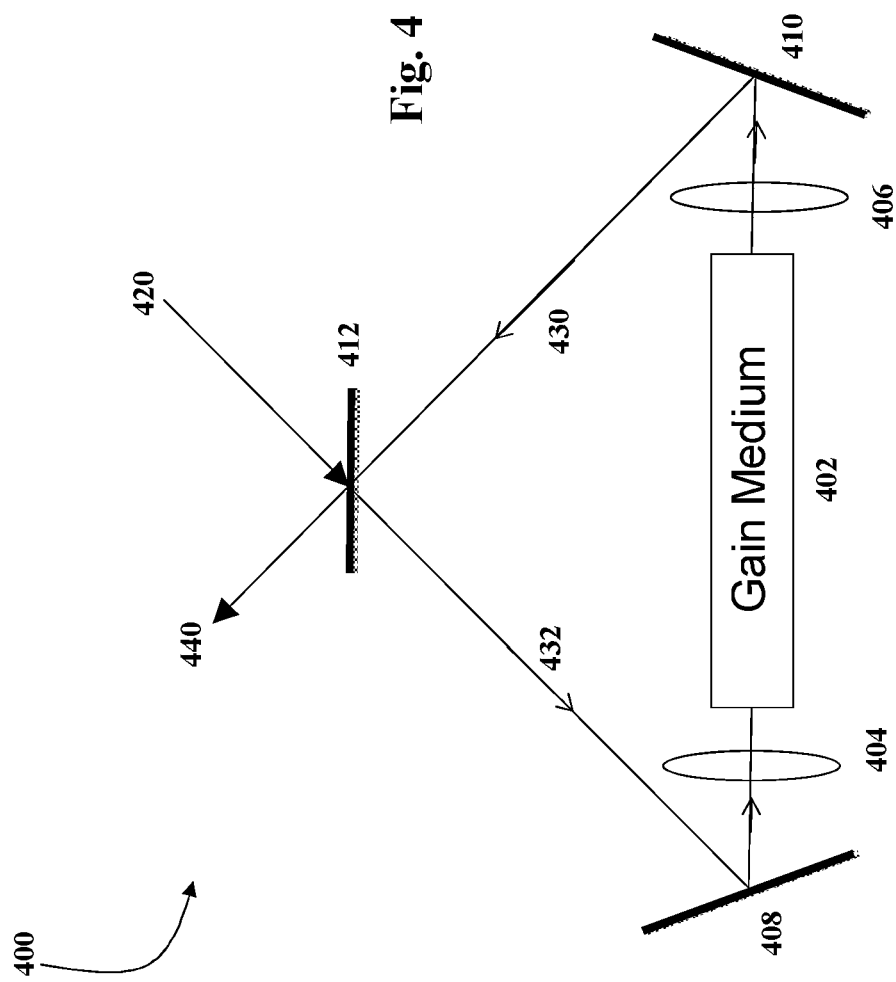
FIG. 4 schematically illustrates a first ring resonator.

FIG. 4 illustrates a first ring resonator 400 embodiment of a single slave oscillator 141 composed of discrete elements. The ring resonator 400 includes a gain medium 402, two lenses (404 and 406) situated at the two ends of the gain medium 402, and three mirrors (408, 410, and 412) positioned such that the light inside the ring resonator 400 is routed to loop through the gain medium 402. The ring geometry is also convenient because the incident beam 420 and output beam 440 take different paths and are therefore easily separated. A low backscatter gain medium 402 is preferred since it ensures that the light inside the ring resonator 400 circulates in only one direction, thereby reducing the isolation problem between the bank of slave oscillators 140 and master oscillator 110 shown earlier in FIG. 1, FIG. 2, and FIG. 3. An input beam 420 is injected into the ring resonator 400. An output beam 440 emerges through the out-coupler mirror 412.

The ring resonator can also be used as a potential configuration for the optical amplifier 120 in FIG. 1, FIG. 2, and FIG. 3. This configuration will result in a zero or very small backscatter, depending on backscatter in the gain medium. The reason for this can be attributed to the characteristics of the ring resonator when it is used as a regenerative amplifier: Once the ring resonator receives an injected signal that circulates in only one direction inside the ring resonator, any backscatter moving in the opposite direction will not be in phase with the forward wave and hence will not be amplified. Accordingly, the bank of optical isolators 130 may be omitted from the architecture 100 shown in FIG. 1 resulting in the semiconductor laser architecture shown in FIG. 2.

Using existing manufacturing methods, a ring resonator with approximately 40-50 watt optical output can be built. The gain medium 402 can be constructed by concatenating multiple gain media from commercially available high power laser diodes by placing them end-to-end. For example, if each 100 micron long commercial gain medium unit supplied 10 watts of optical output, then a 400 micron long unit would provide 40 watts. Numerical calculations based on known physical, electrical and optical parameters of such a device predict that a lock-in power ratio of approximately 10-11 dB is sufficient for successful operation a slave oscillator constructed in this manner. The exact power ratio is a function of the physical, electrical, and optical properties of the device. Based on the predicted 11 dB gain, 3.1 watts of power injected into this example slave oscillator will be sufficient to produce the 40 watt output beam. Therefore, a suitable optical amplifier for such a device should supply approximately 28 watts if there are nine slave oscillators coupled to the amplifier.

The ring resonator 400 can be built on a square base 1 mm on each side or less. Accordingly, four banks of 10 slave oscillators each can be placed on a 1 square cm substrate to produce a total output of 1600 watts (=40 slave oscillators×40 watts each). Optical fiber interconnects can be used to provide flexibility in packaging. Path length differences that arise from this configuration can be compensated for in the beam combiner 150 shown in FIG. 1, FIG. 2, and FIG. 3.

Considering a physical embodiment of the ring resonator 400 where the length of the loop created by the three mirrors (408, 410, and 412) was 1.5 millimeters, taking into consideration the fact that the light waves will slow down as they travel through the gain medium 402 and the two lenses (404, 406) one can expect one loop around the ring to take about 8.7 picoseconds, corresponding to a mode separation of 114.7 GHz. Further assuming that the two mirrors (408 and 410) at the end of the gain medium are perfectly reflecting, then the out-coupler mirror 412 would require a power reflectivity of 0.25 corresponding to a threshold gain of about 17 cm$^{-1}$. This is within the capability of commercially available semiconductor gain media.

Calculations for a nominal semiconductor double heterostructure laser diode gain medium with an expected contact resistance of around 10 milliohms predict a high efficiency device. For example, a 40 ampere semiconductor current, creating 1.38 eV photons (assuming a 0.9 micron wavelength) deposits 55 watts into the semiconductor. Of the 55 optical watts, 52 watts are out-coupled and exit the ring resonator 400 as an output beam 440. The contact resistance is 10 milliohms, so the total power input is 71 watts (which is the sum of 55 watts plus the 16 watts of non-optical power loss). In this arrangement, there is no optical pumping of the gain medium and other optical losses are low, so that the semiconductor gain medium efficiency dominates system efficiency. With 71 watts power input and 52 watts of optical power output from the resonator, the overall efficiency from wall plug to optical output is over 70%. Thus, from the calculation above each output optical kilowatt requires the input of 1.4 electrical kilowatts, assuming negligible losses in the optical system.

In an extended version of the architecture of the high energy semiconductor laser 300 shown in FIG. 3, if we assume that each of the slave oscillators 141 produce a beam 113 with optical power of 40 W, combining nine slave oscillator output beams would result in a 360 W output. If the master oscillator 110 were coupled to three optical amplifiers 120 which were each coupled to nine-unit bank of slave oscillators 140, then the outputs of all banks could be combined to one monochromatic beam with up to 1.08 kW optical power.

Figure 5:
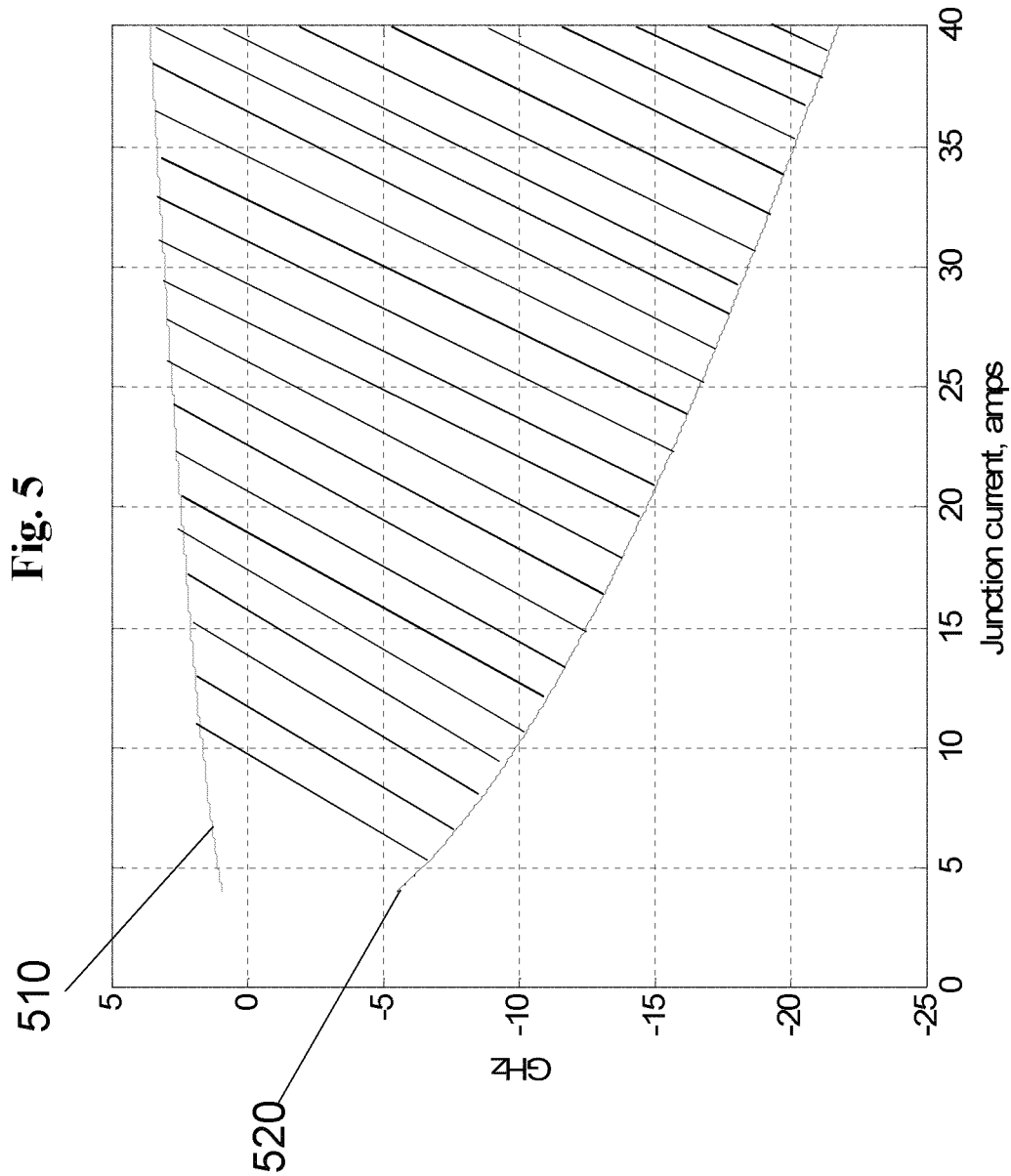
FIG. 5 is a plot showing operational frequency ranges for a slave oscillator.

We again turn our attention now to the master oscillator 110 construction. The structure of the master oscillator 110 can be configured to match the structure of the slave oscillators 141 to ensure maximum mode overlap in what will be a transverse multimode operation since mode orthogonality ensures symmetry that only the master oscillator 110 mode will be regeneratively amplified by the slave oscillators 141. The shaded region in FIG. 5 illustrates the expected lock-in range for the first ring resonator 400 embodiment. The x-axis shows the junction current through the semiconductor laser. The y-axis shows the frequency difference between the master oscillator and the slave oscillator. For a given angular frequency difference which is defined as the injected frequency (from the master oscillator 110) minus the free-running frequency of the slave oscillator, the static lock-in range is determined by two numbers. The positive number is given by the square root of the injected to total power ratio times the reciprocal of the resonator cavity round trip time. The negative number has the same two factors times the square root of 1 plus the linewidth enhancement factor, squared. Hence the negative number is four or five times larger than the positive number. For classical solid state lasers, the linewidth enhancement factor is zero so that the two limits are symmetrical, but because of the linewidth broadening and chirp that occur in semiconductor lasers, arising from fluctuations in carrier density the lock-in range is asymmetric. One can also think about the range of operation as the range of permitted natural resonance frequencies that the slave oscillator can have for an operational system. There is an upper and a lower bound to the frequency offset shown as curves 510 and 520, respectively. The upper bound curve 510 is defined by the set of the positive numbers calculated per junction current. The lower bound curve 520 is defined by the set of negative numbers, again calculated per junctions current. The shaded region between these two curves is the range of operation.

As shown, at 40 ampere junction current, the lock-in range for the frequency offset is more than 25 GHz wide, asymmetrically distributed about zero. This range is about 20% of the longitudinal mode spacing and therefore represents a possible design requirement to be met by the slave oscillator 141 if many of these units are to be locked by one master oscillator 110. This feature is one of the key benefits of the ring resonator embodiment 400 that is approximately 1 mm on each side. A larger embodiment would result in more closely spaced longitudinal modes, leading to less favorable operating and manufacturing margins.

Figure 6:
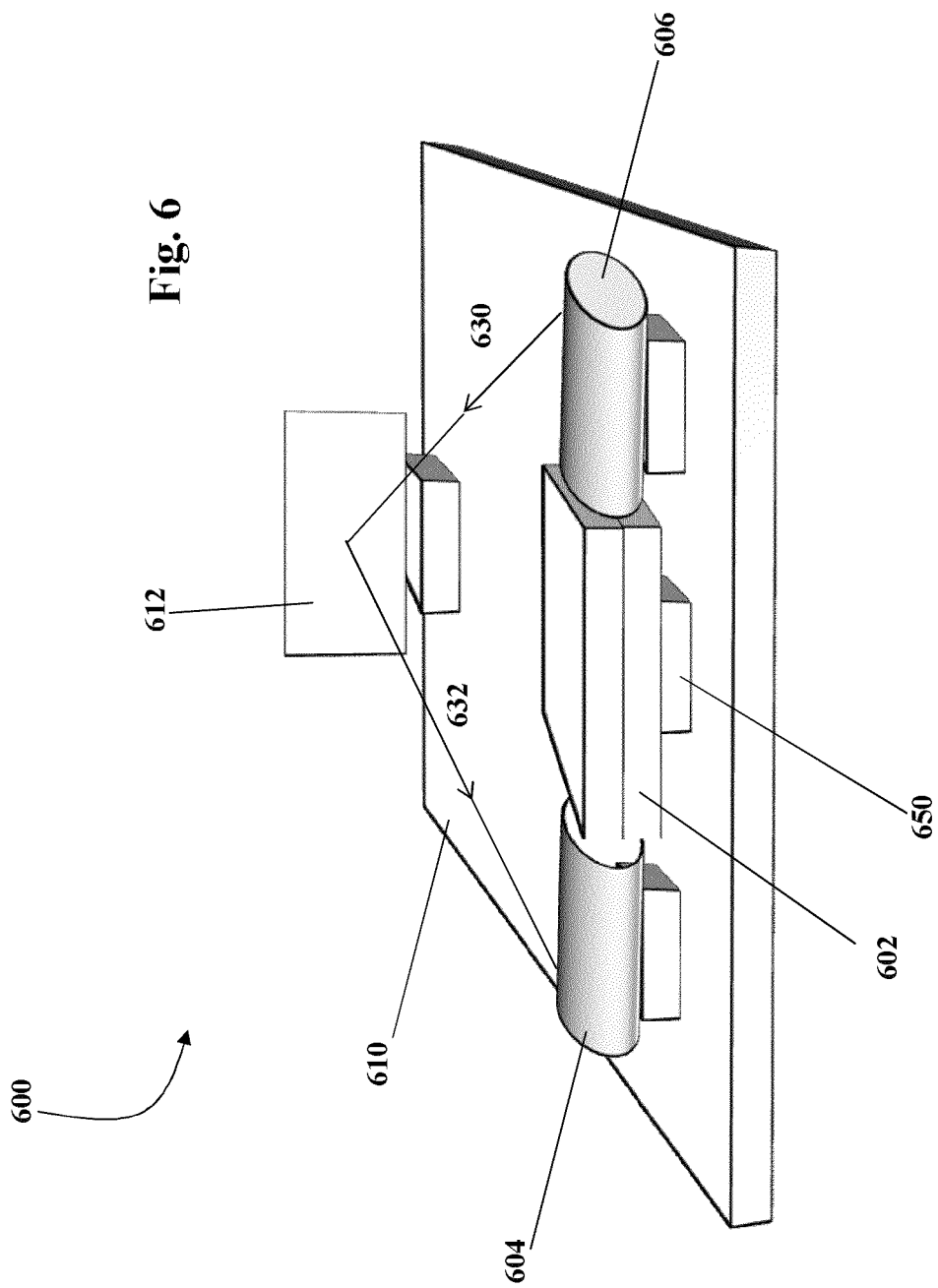
FIG. 6 schematically illustrates a second ring resonator.

FIG. 6 illustrates a second ring resonator 600 embodiment of a single slave oscillator 141. The ring resonator 600 can be manufactured from the same materials as the gain medium, such as gallium arsenide using combinations of existing laser and chemical machining and etching techniques well-known to the art. The length of the sides of the ring resonator base 610 is in the order of one millimeter. A gain medium chip 602 is centered on a silicon pedestal 650 between two optical devices (604 and 606). The optical device 604 transforms the shape of the beam 632 from a primarily circular shape to a highly eccentric ellipse so that it can be put through the gain medium chip 602 without suffering losses. The optical device 604 also reflects the beam 632 it receives from the out-coupler mirror 612 towards the gain medium chip 602. The optical device 606 transforms the shape of the beam exiting the gain medium chip 602 from a highly eccentric ellipse to a primarily circular shaped beam. The optical device 606 also reflects the rays 630 it receives from the gain medium chip 602 towards the out-coupler mirror 612. Both the rays 632 received from the out-coupler mirror and the rays 630 reflected towards it are preferably collimated. One potential material for the optical devices 604 and 606 is gallium arsenide. The gain medium chip can be a double heterostructure laser diode which contains a layer of narrow bandgap material, GaAs sandwiched between two or more wider bandgap layers composed of p and n-doped $Al_{(x)}Ga_{(1-x)}As$, where x indicates mole fraction. GaAs has a refractive index of 3.6 at 0.9 micron wavelength forming the core of the waveguide, and the layers of the doped $Al_{(x)}Ga_{(1-x)}As$, having a lower refractive index, form the cladding.

A person of ordinary skill in the art will recognize that the ring resonator 600, to reach high gain operation, should be aligned such that the round trip path phase shift is approximately an integer number of waves. There are several ways to achieve this end. One option is to change the dimensions of the ring resonator base by using piezoelectric elements while the output is monitored for maximum power. Another option is to insert an optical wedge into the paths of either or both of the beams 630 and 632 to adjust their respective optical path lengths in a controlled manner. Yet another option is varying the current through the gain medium chip 602, thereby modifying the effective optical path-length, as the gain refractive index depends on the carrier density.

Figure 7:
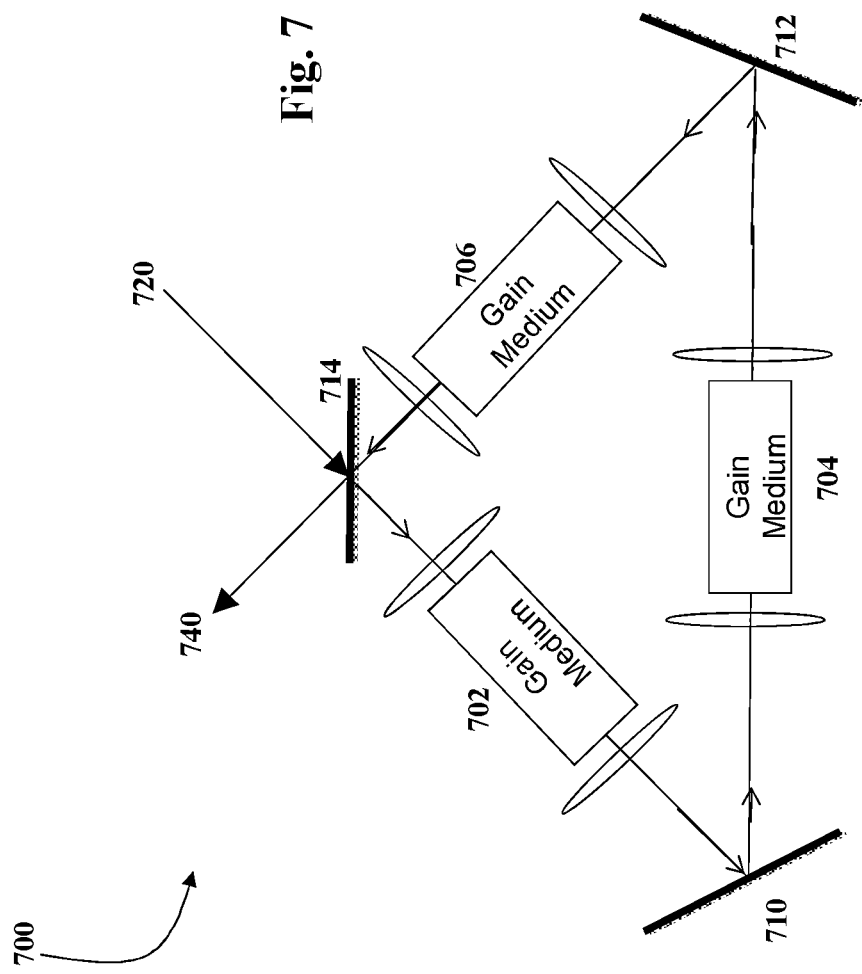
FIG. 7 schematically illustrates a third ring resonator.

FIG. 7 illustrates a third ring resonator 700 embodiment of a single slave oscillator 141. The ring resonator 700 includes three gain media 702, 704, and 706, three pairs of lenses positioned at the two ends of each gain media and three mirrors (710, 712, and 714) positioned such that the light inside the ring resonator 700 is routed to loop through the gain media 702, 704, and 706. The ring geometry is convenient because the incident beam 720 and output beam 740 take different paths and are therefore easily separated. Low backscatter gain media are preferred since they ensure that the light inside the ring resonator 700 circulates in only one direction, thereby reducing the isolation problem between the bank of slave oscillators 140 and master oscillator 110 shown earlier in FIG. 1, FIG. 2, and FIG. 3. An input beam 720 is injected into the ring resonator 700 through the out-coupler mirror 714. An output beam 740 emerges through the same out-coupler mirror 714. One advantage of the three mirror embodiment 700 is the fact that errors in the alignment of the mirrors can be compensated for by tilting the input beam 720.

Figure 8:
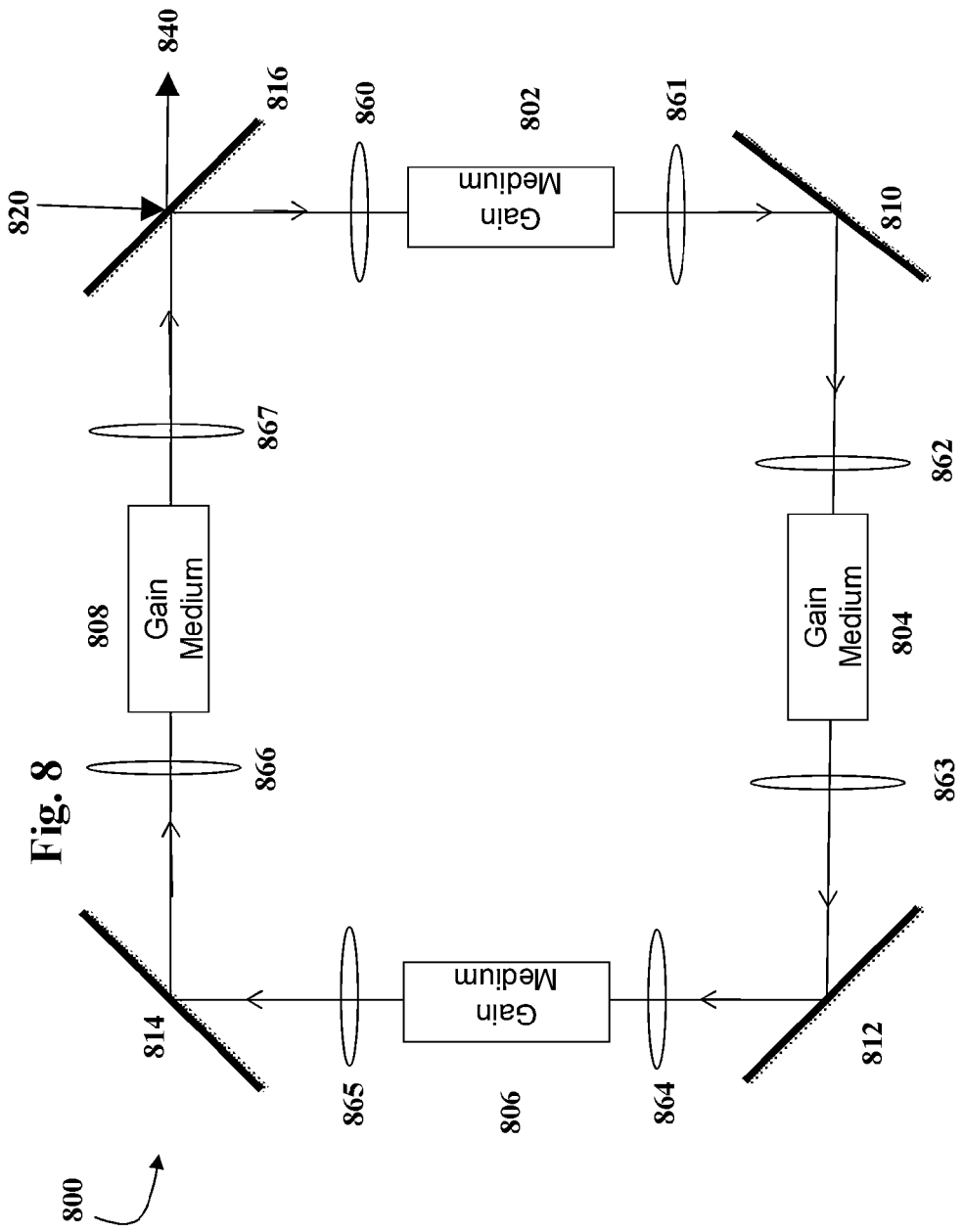
FIG. 8 schematically illustrates a fourth ring resonator.

FIG. 8 illustrates a fourth ring resonator 800 embodiment of a single slave oscillator 141. The ring resonator 800 includes four gain media 802, 804, 806, and 808, and four mirrors (810, 812, 814, and 816) positioned such that the light inside the ring resonator 800 is routed to loop through the gain media 802, 804, 806, and 808. Four pairs of lenses (860, 861; 862, 863; 864, 865; and 866, 867) are positioned at the two ends of each gain media to shape the beams between the gain media. The ring geometry is convenient because the incident beam 820 and output beam 840 take different paths and are therefore easily separated. Low backscatter gain media are preferred since they ensure that the light inside the ring resonator 800 circulates in only one direction, thereby reducing the isolation problem between the bank of slave oscillators 140 and master oscillator 110 shown earlier in FIG. 1, FIG. 2, and FIG. 3. An input beam 820 is injected into the ring resonator 800 through the out-coupler mirror 816. An output beam 840 emerges through the same out-coupler mirror 816. One advantage of the four mirror embodiment 800 is the fact that once the arrangement of mirrors is aligned, its geometry remains robust against tilts in the input beam 820. A pair of lenses at the two ends of each gain medium may be added to render the beam shapes between the gain media compatible such that little or no optical loss results from mismatches.

Figure 9:
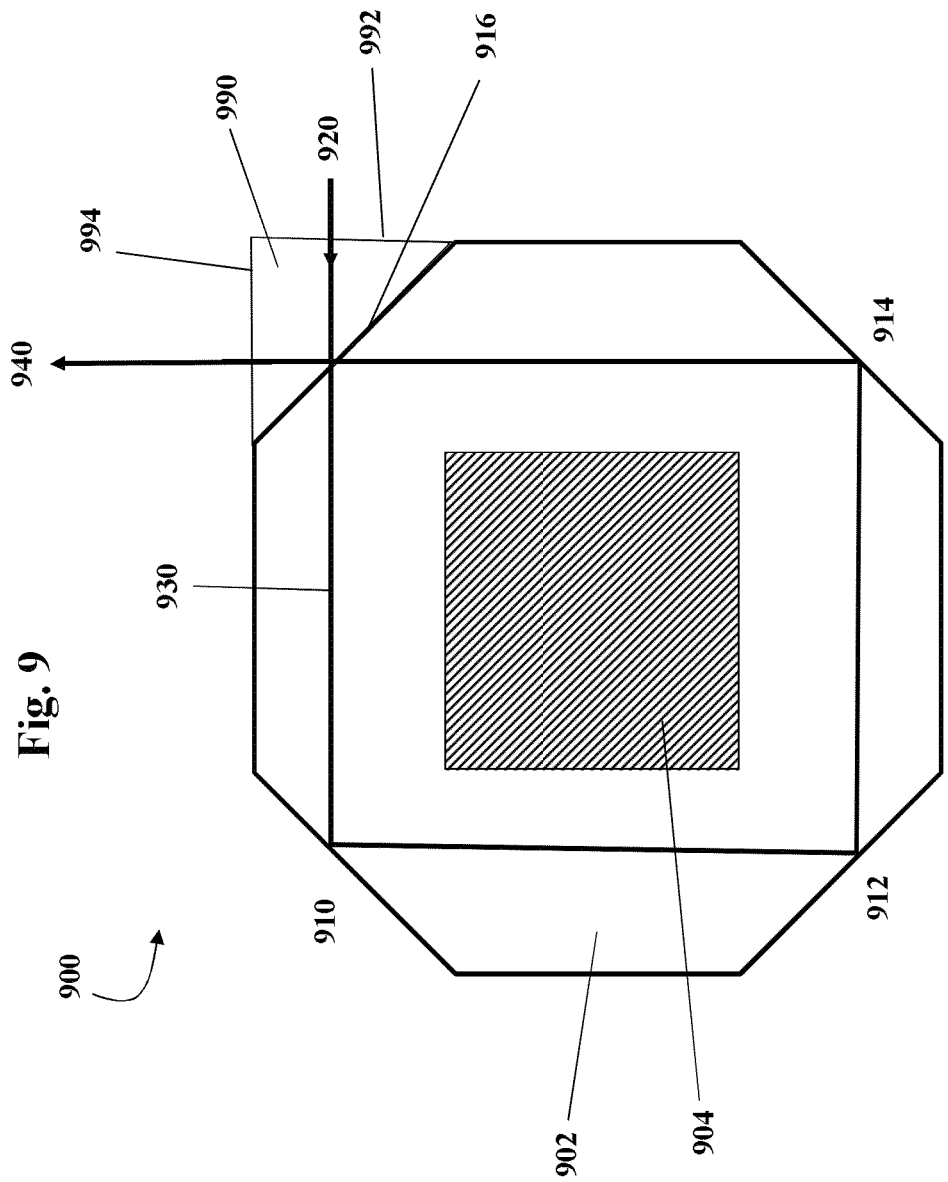
FIG. 9 schematically illustrates a fifth ring resonator.

The first, second, third, and fourth ring resonator embodiments described thus far include discrete components as well as an air path. All of these embodiments further include lenses for beam shaping. FIG. 9 illustrates a fifth ring resonator 900 embodiment of a single slave oscillator 141 shown in cross section view, that combines many discrete components inside a single solid block 902. The solid block 902 can be a multifaceted block made of a lasing material, such as gallium arsenide. The solid block 902 may further contain a low refractive index center 904 to constrain the mode horizontally. The solid block 902 may further include a single continuous or a plurality of high gain regions constructed in the form of double heterostructure laser diodes. As mentioned earlier, the double heterostructure laser diode contains a layer of narrow bandgap material, such as GaAs sandwiched between two or more wider bandgap layers. The wider bandgap material is usually composed of p and n-doped $Al_{(x)}$ $Ga_{(1-x)}As$, where x indicates mole fraction. GaAs has a refractive index of 3.6 at 0.9 micron wavelength forming the core of the waveguide, and the layers of the doped $Al_{(x)}Ga_{(1-x)}As$, having a lower refractive index, form the cladding. Furthermore, it is possible to change the refractive index of $Al_{(x)}$ $Ga_{(1-x)}As$ by varying the value of x. By substantially containing the light looping inside the solid block 902 within the waveguide, the need for lenses between high gain regions may be eliminated. The edge facets 910, 912, and 914 of the solid block 902 are configured to provide total internal reflection (TIR) such that an input beam 920 injected into the solid block 902 through the out-coupler facet 916 is routed to loop inside the solid block 902. The out-coupler facet 916 is also configured such that an output beam 940 emerges through the same out-coupler facet 916. One of several options is to abut a corner element 990 to the out-coupler facet 916 positioned close to, but not in contact with face 916 as an evanescent-wave output coupler known to those skilled in the art. The corner element may have antireflective (AR) coatings on its outer surfaces 992 and 994. The corner element 990 allows the input beam 920 and the output beam 940 to transmit through the out-coupler facet 916. The material of the corner element 990 is selected so that it has substantially the same refractive index as the cladding layer. The ring geometry is convenient because the incident beam 920 and output beam 940 take different paths and are therefore easily separated. A low backscatter material is preferred for the composition of solid block 902 since it ensures that the light with the central ray 930 looping inside the ring resonator 900 circulates in only one direction, thereby reducing the isolation problem between the bank of slave oscillators 140 and master oscillator 110 shown earlier in FIG. 1, FIG. 2, and FIG. 3.

The solid block 902 volume may be shaped as a polyhedron, usually with substantially parallel top and bottom facets and multiple side facets, such as a triangular prism, a tetragonal prism, a pentagonal prism, a hexagonal prism, and the like. At least one facet is configured to allow an input beam to enter the solid block 902 and an output beam to exit the solid block 902. One or more high gain regions arranged in a ring configuration in series may be embedded inside the solid block 902. Many gain regions can thus be included until the photon flux inside the solid block 902 reaches a damage threshold. Thus by choosing the geometry, subject to any length limitations of the high gain region, one can scale up the output power of ring resonator 900 to any desired level. The solid block 902 with its high gain regions can be manufactured using combinations of existing laser and chemical machining and etching techniques well-known to the art with optical polishing at the reflection sides to get a high quality reflection.

Figure 10:
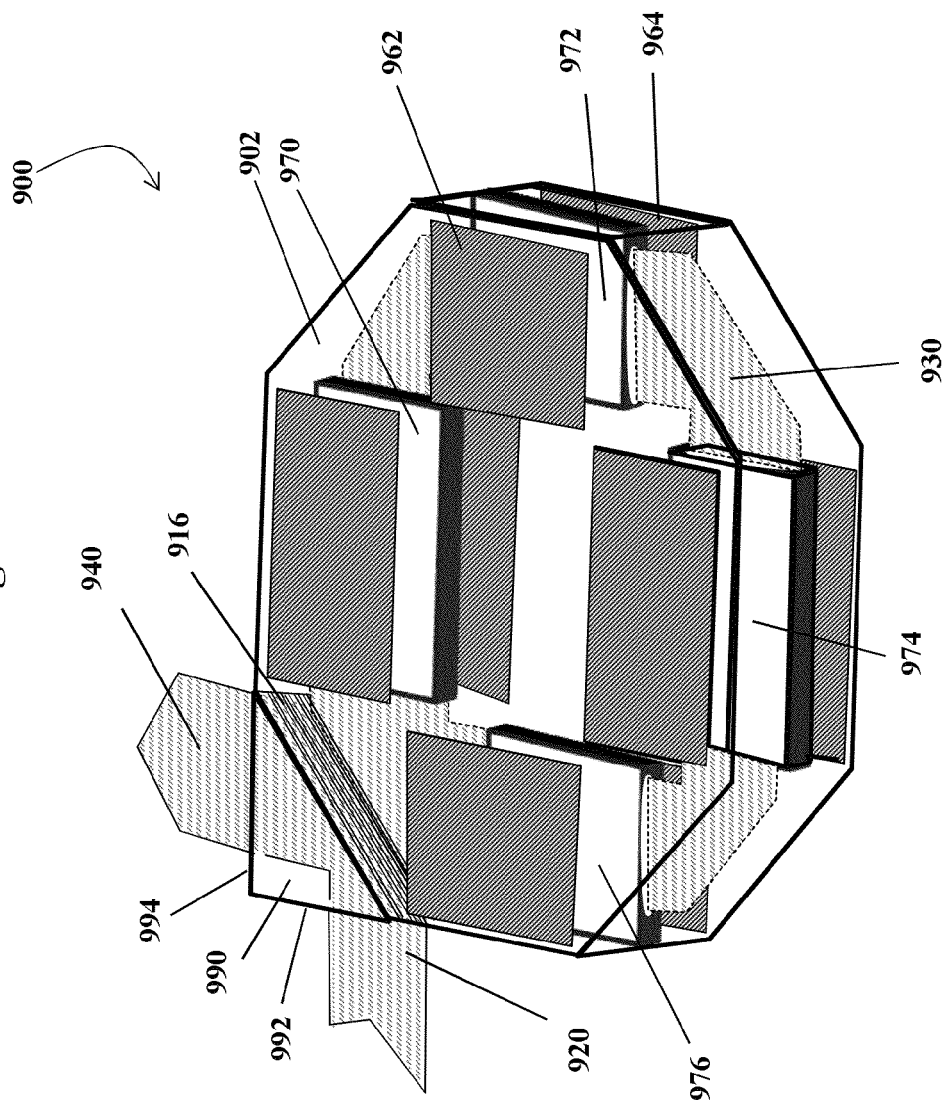
FIG. 10 schematically illustrates the fifth ring resonator in three dimensions.

FIG. 10 illustrates an example of the fifth ring resonator 900 embodiment in three dimensions. The ring resonator 900 includes a solid block 902. The solid block 902 is an octagonal prism made of a lasing material such as gallium arsenide. It has eight side facets. The solid block 902 may also be very thin, with only a few microns between its top and bottom surfaces. The solid block 902 is shown to include four high gain regions 970, 972, 974, and 976. These high gain regions can be constructed in the form of double heterostructure laser diodes, each containing a layer of narrow bandgap material sandwiched between two wide bandgap layers. One commonly used pair of materials is gallium arsenide with aluminum gallium arsenide. Each of these high gain regions is activated by current flow between the corresponding top electrode 962 and the corresponding bottom electrode 964. Contacts may be made to the electrodes to allow for electrical connections from external sources. Seven side facets of the solid block 902 are configured to provide nearly total internal reflection. The eighth facet is the out-coupler facet 916. An input beam 920 injected into the solid block 902 through the eighth out-coupler side facet 916 is routed to loop inside the solid block 902 through the four high gain regions 970, 972, 974, and 976. The out-coupler facet 916 is further configured such that an output beam 940 containing a substantial fraction of the circulating beam with the central ray 930 emerges through the same out-coupler facet 916. The rest of the circulating beam with the central ray 930 is reflected by facet 916 to continue around the ring. A corner element 990 may be abutted to the out-coupler facet 916 positioned close to, but not in contact with face 916 as an evanescent-wave output coupler known to those skilled in the art. The corner element may have antireflective (AR) coatings on its outer surfaces 992 and 994. The corner element 990 allows the input beam 920 and the output beam 940 to transmit through the out-coupler facet 916. The corner element 990 has substantially the same refractive index as the cladding layer.

FIG. 11 illustrates top and bottom views of another solid block 1102 fashioned as a hexagonal prism along with its cross section. Three high gain regions 1170, 1172, and 1174 are embedded inside the solid block 1102. The shaded high gain regions 1170 1172 and 1174 generally coincide with the top and bottom electrode positions 1162 and 1164 in the three dimensional top and bottom views. The solid block 1102 material may be AlGaAs. It is possible to change the refractive index of the gain medium 1102 by varying the value of x in the formula $Al_{(x)}Ga_{(1-x)}As$, where x indicates mole fraction. The high gain regions 1170 1172 and 1174 may be fashioned as a double heterostructure laser diodes which contain a layer of GaAs sandwiched between two or more layers of p and n-doped AlGaAs. The refractive index of GaAs is approximately 3.6 whereas the refractive index of AlGaAs is approximately 3.2. Thus, AlGaAs acts as a cladding around the GaAs waveguide core inside the high gain regions. The area enclosed by the internal equilateral triangle 1104 may also be composed of AlGaAs which acts as cladding. Furthermore, there is a cladding surface top and bottom of the high gain regions 1170 1172 and 1174, which confines the waves in the plane of the cross section. The internal beam is thus confined both laterally and vertically inside the high gain regions.

If we assume that each of the high gain regions 1170, 1172, and 1174 is 400 microns long, 100 microns wide, and 3 microns thick, using simple trigonometry the central ray path 1130 length can be determined to equal approximately 1730 microns. Consequently, the travel time for the central ray path 1130 is approximately 20.7 psec and the free spectral range is its reciprocal or 48 GHz.

One of the three side facets 1110, 1112, and 1114 is configured to be the out-coupling facet for receiving an input beam and out-coupling the output beam. The outside surface of out-coupling facet is AR coated such as to permit a fixed fraction of the incident internal beam to escape. To avoid diffraction, the pentagonal shaped sections 1150, 1152, and 1154 between the ends of the high gain regions 1170 1172 and 1174 and the facets 1110 1112 and 1114 may be made of GaAs—the same material sandwiched inside the high gain regions. The thickness of the sandwich is an important consideration since the thicker the sandwich, the greater the electrical resistance and hence greater waste heat generation, which is usually undesirable. On the other hand, the sandwich layer should be thick enough to contain the evanescent wave. Calculations pertaining to the dimensions of the lowest order mode in the active waveguide show that the cladding needs to be a micron or so thick. The same is true for the edges of the high gain regions. Hence, the total thickness of the solid block 1102 (or, the height of the hexagonal prism in FIG. 11) can be as little as 5 microns. This thickness is well within existing manufacturing capabilities.

Thus, a high energy semiconductor laser is disclosed. While embodiments of these inventions have been shown and described, it will be apparent to those skilled in the art that many more modifications are possible without departing from the inventive concepts herein. The inventions, therefore, are not to be restricted except in the spirit of the following claims.

What is claimed is:

1. A semiconductor laser comprising:
a master oscillator configured to emit a first stage laser beam,
an optical amplifier configured to receive and add optical power to the first stage laser beam producing a second stage beam,
a plurality of ring resonators, each configured as a regenerative amplifier to receive a portion of the second stage laser beam along a first direction, add optical power to the portion of the second stage laser beam, and emit a third stage laser beam along a second direction, wherein the second stage laser beam and the third stage laser beam have substantially identical wavelengths and phase, each ring resonator comprising a gain region of at least one semiconductor laser diode, a semireflective mirror configured to receive an input beam along the first direction and emit an output beam along the second direction, a plurality of reflecting mirrors wherein each gain medium is disposed between two of the reflecting mirrors, wherein the semireflective mirror and reflective mirror form a circulating optical path which passes through at least one gain medium, and
a beam combiner configured to receive and coherently combine into a single monochromatic laser beam at least two of the third stage laser beams.

2. A semiconductor laser comprising:
a master oscillator configured to emit a first stage laser beam,
an optical amplifier configured to receive and add optical power to the first stage laser beam producing a second stage laser beam,
a plurality of ring resonators, each configured as a regenerative amplifier to receive a portion of the second stage laser beam along a first direction, add optical power to the portion of the second stage laser beam, and emit a third stage laser beam along a second direction, wherein the second stage laser beam and the third stage laser beam have substantially identical wavelengths and phase, each ring resonator comprising a solid block of gallium arsenide having at least one coupling facet configured to partially transmit light and a plurality of internally reflective facets wherein when the second stage laser beam passes through the coupling facet along the first direction, and the remaining facets are configured to circulate the second stage beam within the solid block,
a plurality of evanescent-wave output couplers each optically coupled to the coupling facet of one of the ring resonators and configured to transmit the second stage laser beam through the coupling facet into the solid block along the first direction and receive the third stage beam from the solid block through the coupling facet along the second direction, and a beam combiner configured to receive and coherently combine into a single monochromatic laser beam at least two of the third stage laser beams.

\* \* \* \* \*